United States Patent
Rofougaran

(10) Patent No.: US 7,646,824 B2
(45) Date of Patent: *Jan. 12, 2010

(54) METHOD AND SYSTEM FOR A FAST-SWITCHING PHASE-LOCKED LOOP USING A DIRECT DIGITAL FREQUENCY SYNTHESIZER

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 131 days.

This patent is subject to a terminal disclaimer.

(21) Appl. No.: 11/680,253

(22) Filed: Feb. 28, 2007

(65) Prior Publication Data

US 2008/0204150 A1 Aug. 28, 2008

(51) Int. Cl.
H03K 7/06 (2006.01)
(52) U.S. Cl. ........................ 375/271; 375/235; 375/324
(58) Field of Classification Search ................ 375/235, 375/271, 324, 259, 296, 299
See application file for complete search history.

(56) References Cited

U.S. PATENT DOCUMENTS 6,778,117 B1 * 8/2004 Johnson ...................... 341/144
2005/0117071 A1 * 6/2005 Johnson ...................... 348/729
2005/0220219 A1 * 10/2005 Jensen ......................... 375/302
2006/0007999 A1 * 1/2006 Gomez et al. ............... 375/235
2006/0209986 A1 * 9/2006 Jensen et al. ................ 375/302

* cited by examiner

Primary Examiner—Vibol Tan
(74) Attorney, Agent, or Firm—McAndrews, Held & Malloy, Ltd.

(57) ABSTRACT

Aspects of a method and system for a fast-switching Phase-Locked Loop using a Direct Digital Frequency synthesizer may include generating a second signal from a first signal by: frequency translating an inphase component of the first signal utilizing a filtered fast-switching oscillating signal generated using at least a direct digital frequency synthesizer (DDFS), and frequency translating a corresponding quadrature component of the first signal utilizing a phase-shifted version of the generated and filtered fast-switching oscillating signal. The inphase and quadrature components of the first signal may be multiplied with the filtered fast-switching oscillating signal and a phase-shifted version of the filtered fast-switching oscillating signal, respectively. The filtered fast-switching oscillating signal may be obtained by removing at least one frequency-sum term of the fast-switching oscillating signal, where the fast-switching signal oscillating signal may be generated from a signal generated by the DDFS that may be multiplied with an oscillating reference signal.

52 Claims, 5 Drawing Sheets

METHOD AND SYSTEM FOR A FAST-SWITCHING PHASE-LOCKED LOOP USING A DIRECT DIGITAL FREQUENCY SYNTHESIZER

CROSS-REFERENCE TO RELATED APPLICATIONS/INCORPORATION BY REFERENCE

This application makes reference to:
U.S. application Ser. No. 11/680,044, filed on Feb. 28, 2007;
U.S. application Ser. No. 11/680,236, filed on;
U.S. application Ser. No. 11/680,165, filed on Feb. 28, 2007;
U.S. application Ser. No. 11/680,176, filed on Feb. 28, 2007;
U.S. application Ser. No. 11/680,188, filed on Feb. 28, 2007; and
U.S. application Ser. No. 11/680,370, filed on Feb. 28, 2007.

Each of the above referenced applications is hereby incorporated herein by reference in its entirety.

FIELD OF THE INVENTION

Certain embodiments of the invention relate to signal processing for communication systems. More specifically, certain embodiments of the invention relate to a method and system for a fast-switching Phase-locked Loop using a Direct Digital Frequency Synthesizer.

BACKGROUND OF THE INVENTION

A Direct Digital Frequency Synthesizer (DDFS) is a digitally-controlled signal generator that may vary the output signal frequency over a large range of frequencies, based on a single fixed-frequency precision reference clock. In addition, a DDFS is also phase-tunable. In essence, within the DDFS, discrete amplitude levels are fed to a Digital-to-Analog Converter (DAC) at a sampling rate determined by the fixed-frequency reference clock. The output of the DDFS provides a signal whose shape depends on the sequence of discrete amplitude levels that are fed to the DAC at the constant sampling rate. The DDFS is particularly well suited as a frequency generator that outputs a sine or other periodic waveforms over a large range of frequencies, from almost DC to approximately half the fixed-frequency reference clock frequency.

A DDFS offers a larger range of operating frequencies and requires no feedback loop, thereby providing near instantaneous phase- and frequency changes, avoiding over- and undershooting and settling time issues associated with another analog systems. A DDFS may provide precise digitally-controlled frequency and/or phase changes without signal discontinuities.

In some communication systems, inphase and quadratrue channels are modulated onto a carrier frequency that may be generated and controlled in an analog Phase-Locked Loop comprising a phase detector, a loop filter, an amplifier and a voltage controlled oscillator in a feedback-loop configuration. These analog PLLs are limited to operations within a narrow range of frequencies, sometimes referred to as the lock range. Furthermore, because of the feedback-loop configuration, any change in frequency may require the analog PLL to transition to a new steady-state. Hence, the rate of frequency changes may be limited to how fast the analog PLL may settle. For these reasons, some analog PLLs may not be suited to wideband operations with fast-switching of frequencies.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a fast-switching Phase-locked Loop using a Direct Digital Frequency Synthesizer, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a fast-switching Phase-locked Loop using a Direct Digital Frequency Synthesizer. Aspects of a method and system for a fast-switching Phase-locked Loop using a Direct Digital Frequency Synthesizer may include generating a second signal from a first signal by: frequency translating an inphase component of the first signal utilizing a filtered fast-switching oscillating signal generated using at least a direct digital frequency synthesizer (DDFS), and frequency translating a corresponding quadrature component of the first signal utilizing a phase-shifted version of the generated and filtered fast-switching oscillating signal. The filtered fast-switching oscillating signal may be generated by filtering a fast-switching oscillating signal.

The inphase and quadrature components of the first signal may be multiplied with the filtered fast-switching oscillating signal and a phase-shifted version of the filtered fast-switching oscillating signal, respectively. The filtered fast-switching oscillating signal may be obtained by removing at least one frequency-sum term of the fast-switching oscillating signal, where the fast-switching signal oscillating signal may be generated from a signal generated by the DDFS that may be multiplied with an oscillating reference signal. The oscillating reference signal may comprise a fixed-frequency. By frequency-dividing a high-frequency oscillating signal, the fixed-frequency oscillating reference signal may be generated. The DDFS may be clocked by the high-frequency oscillating signal. The second signal may be generated during demodulation or during modulation of the first signal. Filtering of the fast-switching oscillating signal may utilize a high-pass filter, a low-pass filter or a switchable filter that switches between high-pass and low-pass filtering characteristics.

Figure 1A:
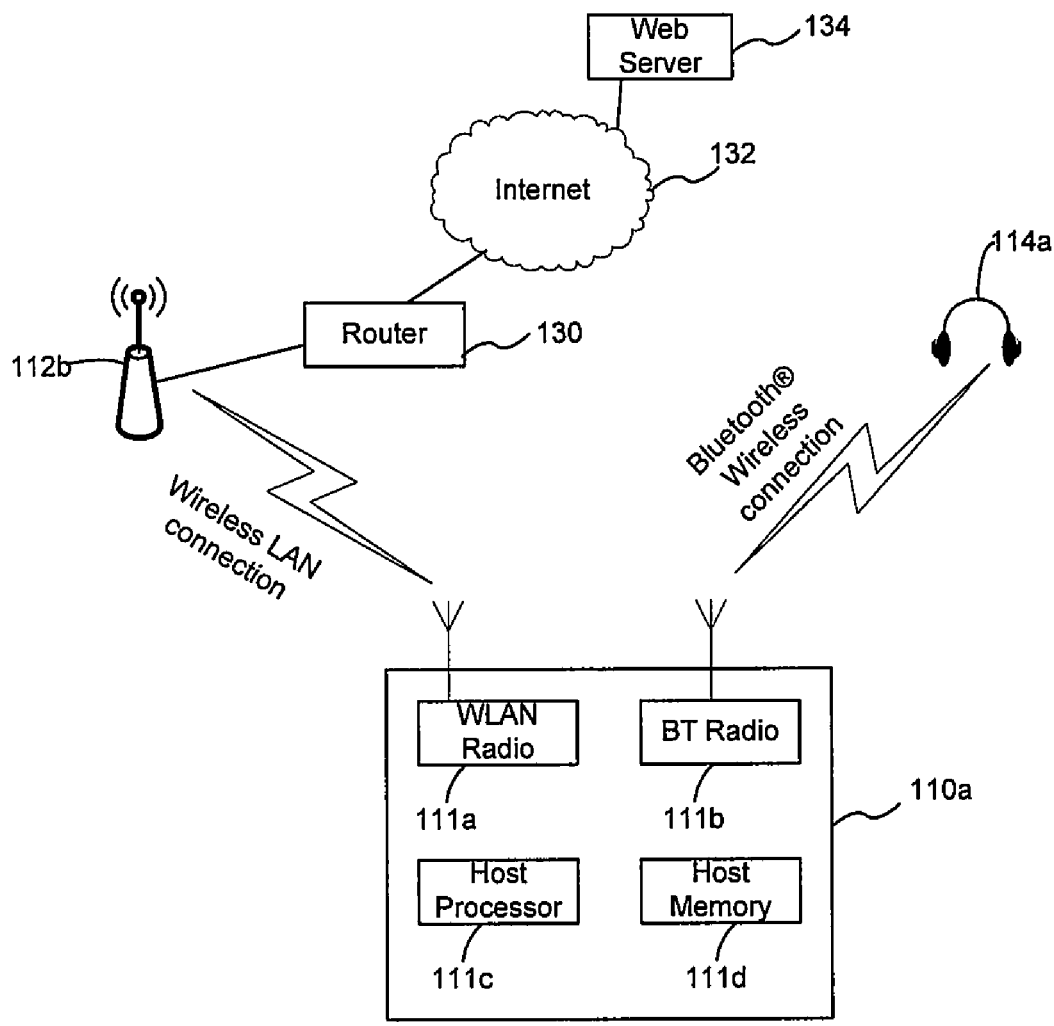
FIG. 1A is a diagram illustrating an exemplary WLAN and Bluetooth® wireless communication system, in connection with an embodiment of the invention.

FIG. 1A is a diagram illustrating an exemplary WLAN and Bluetooth® wireless communication system, in connection with an embodiment of the invention. Referring to FIG. 1, there is shown a WLAN access point 112b, a computer 110a, a Bluetooth® headset 114a, a router 130, the Internet 132 and a web server 134. The computer or host device 110a may comprise a wireless LAN (WLAN) radio 111a, a Bluetooth® radio 111b, a host processor 111c, and a host memory 111d. There is also shown a Wireless LAN (WLAN) connection between the wireless LAN radio 111a and the wireless LAN access point 112b, and a Bluetooth® wireless connection between the Bluetooth® radio 111b and the Bluetooth® headset 114a.

Frequently, computing and communication devices may comprise hardware and software to communicate using multiple wireless communication standards. The WLAN radio 111a may be compliant with IEEE 802.11 standard. There may be instances when the WLAN radio 111a and the Bluetooth® radio 111b may be active concurrently. For example, it may be desirable for a user of the computer or host device 110a to access the Internet 132 in order to consume streaming content from the Web server 134. Accordingly, the user may establish a WLAN connection between the computer 110a and the access point 112b. Once this connection is established, the streaming content from the Web server 134 may be received via the router 130, the access point 112b, and the WLAN connection, and consumed by the computer or host device 110a.

It may be further desirable for the user of the computer 110a to listen to an audio portion of the streaming content on the Bluetooth® headset 114a. Accordingly, the user of the computer 110a may establish a Bluetooth® wireless connection with the Bluetooth® headset 114a. Once the Bluetooth® wireless connection is established, and with suitable configurations on the computer enabled, the audio portion of the streaming content may be consumed by the Bluetooth® headset 114a. In instances where such advanced communication systems are integrated or located within the host device 110a, the RF frequency generation may support fast-switching to enable support of multiple communication standards and/or advanced wideband systems like, for example, Ultrawideband (UWB) radio.

Figure 1B:
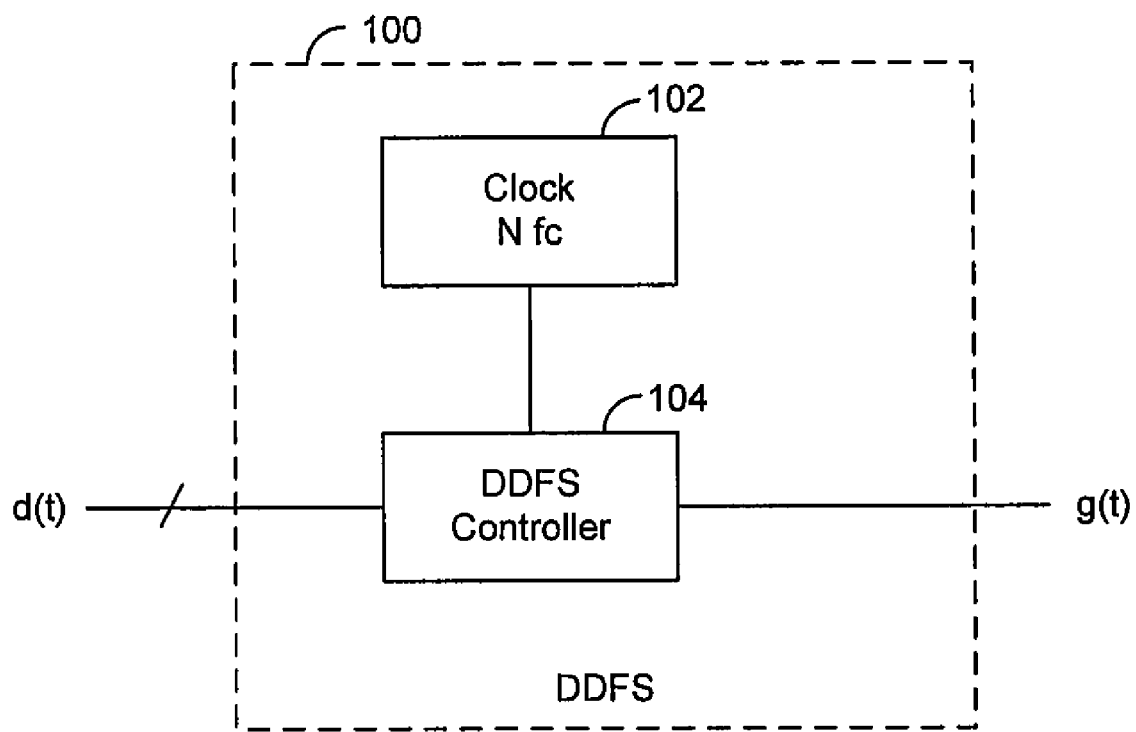
FIG. 1B is a block diagram illustrating an exemplary Direct Digital Frequency Synthesizer (DDFS), in connection with an embodiment of the invention.

FIG. 1B is a block diagram illustrating an exemplary Direct Digital Frequency Synthesizer (DDFS), in connection with an embodiment of the invention. Referring to FIG. 1B, there is shown a DDFS 100, a clock 102 and a DDFS controller 104. There is also shown a digital input signal d(t) and an analog output signal g(t).

The DDFS 100 may be a digitally-controlled signal generator that may vary the analog output signal g(t) over a large range of frequencies, based on a single fixed-frequency precision reference clock, which may be clock 102. In addition, the DDFS 100 is also phase-tunable. The digital input signal d(t) may comprise control information about the frequency and/or phase of the analog output signal g(t) that may be generated as a function of the digital input signal d(t). The clock 102 may provide a reference clock that may be N times higher than the frequency fc that may be generated at the output signal g(t). Using the clock 102 and the information that may be contained in the digital input signal d(t), the DDFS controller 104 may generate a variable frequency analog output signal g(t).

Figure 2:
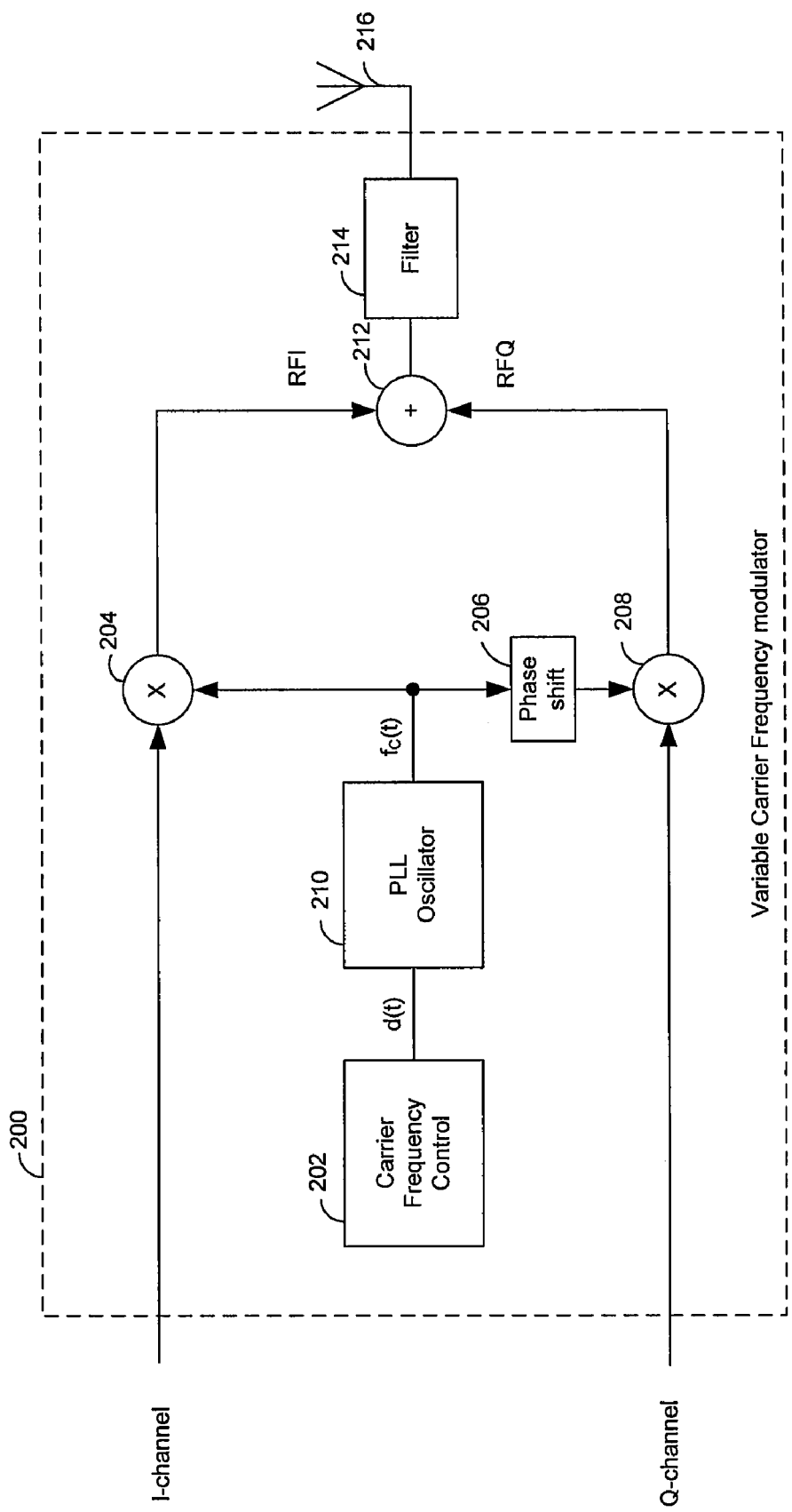
FIG. 2 is block diagram illustrating an exemplary embodiment of a variable carrier frequency modulator for an inphase and quadrature channel, in accordance with an embodiment of the invention.

FIG. 2 is block diagram illustrating an exemplary embodiment of a variable carrier frequency modulator for an inphase and quadrature channel, in accordance with an embodiment of the invention. Referring to FIG. 2, there is shown a variable carrier frequency modulator 200 that may be coupled to an antenna 216. The variable carrier frequency modulator 200 may comprise a carrier frequency control 202, a Phase-Locked Loop (PLL) oscillator 210, multipliers 204 and 208, a phase shift block 206, a summation block 212, and a filter 214. There is also shown an inphase (I) channel signal, a quadrature (Q) channel signal, a PLL control signal d(t), a carrier frequency signal $f_C(t)$, a modulated I-channel signal RFI, and a modulated Q-channel signal RFQ.

In some communication systems, the I-channel and the Q-channel may be modulated onto the carrier frequency separately and may be added after modulation and before transmission. The I-channel signal may be modulated onto the carrier frequency signal $f_c(t)$ by multiplying the I-channel signal with the carrier frequency signal $f_c(t)$ in the multiplier 204. The output signal of multiplier 204 may be the modulated I-channel signal RFI. The Q-channel signal may be modulated onto a phase-shifted carrier frequency signal by multiplying the Q-channel signal with the phase-shifted carrier frequency signal in the multiplier 208. The phase-shifted carrier frequency may be obtained by shifting the phase of the carrier frequency signal $f_c(t)$ in phase shift block 206. The phase shift block 206 may, for example, shift the phase of the carrier frequency signal by 90 degrees. The output signal of the multiplier 208 may be the modulated Q-channel signal RFQ. The PLL oscillator 210 may be controlled by the carrier frequency control 202 via the PLL control signal d(t). In some transmission systems, the carrier frequency signal $f_c(t)$ may change quickly; for example in Orthogonal Frequency Division Multiplexing (OFDM) systems. In other systems, the carrier frequency control 202 may select one of a few, rarely changing transmission channels.

Figure 3:
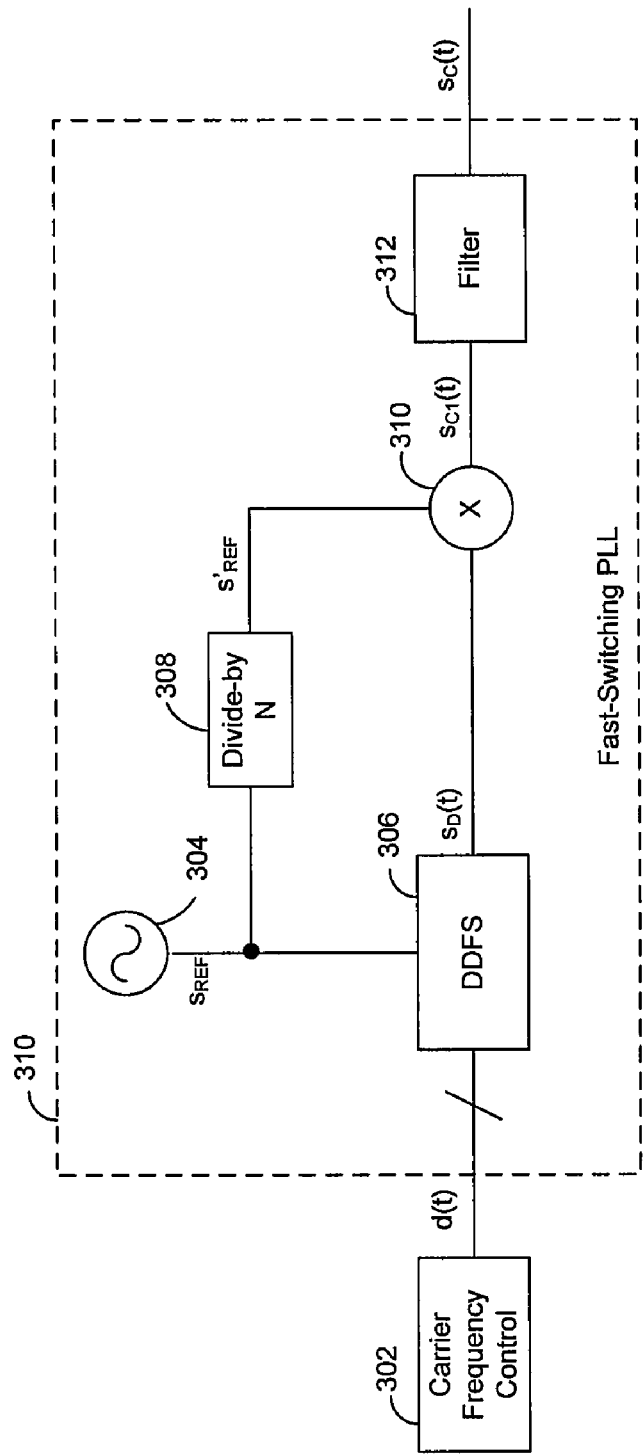
FIG. 3 is a block diagram illustrating an exemplary embodiment of a fast-switching wideband PLL oscillator using a DDFS, in accordance with an embodiment of the invention.

FIG. 3 is a block diagram illustrating an exemplary embodiment of a fast-switching wideband PLL oscillator using a DDFS, in accordance with an embodiment of the invention. Referring to FIG. 3, there is shown a carrier frequency control 302 and a fast-switching PLL 310. The fast-switching PLL 310 may comprise a reference oscillator 304, a Direct Digital Frequency Synthesizer (DDFS) 306, a frequency divider 308, a multiplier 310 and a filter 312. There is also shown a DDFS control signal d(t), a reference frequency signal $s_{REF}$, a DDFS output signal $s_D(t)$, a divided reference frequency signal $s'_{REF}$, an unfiltered carrier frequency signal $s_{C1}(t)$, and a carrier frequency signal $s_C(t)$.

The carrier frequency control 302 and the fast-switching PLL 310 may be an exemplary embodiment of the carrier frequency control 202 and the PLL oscillator 210 of the variable carrier frequency modulator 200 illustrated in FIG. 2. An embodiment of the invention illustrated in FIG. 3 may also be used in a receiver structure instead of a transmitter structure as shown in FIG. 2.

The carrier frequency control 302 may comprise suitable logic, circuitry and/or code that may be enabled to generate a DDFS control signal d(t). In an embodiment of the invention, the DDFS control signal d(t) may be equal to the PLL control signal d(t) in FIG. 2. Because the DDFS 306 may be controlled by a digital control signal, the DDFS control signal d(t) that may be generated by the carrier frequency control 302 may be digital. The DDFS control signal d(t) may comprise information that may allow controlling the output frequency $f_D(t)$ and phase of the DDFS output signal $s_D(t)$. The frequency $f_D(t)$ may be time-varying, for example, because the carrier frequency may change quickly. The DDFS output signal $s_D(t)$ may be approximately sinusoidal.

In accordance with an embodiment of the invention, the DDFS 306 may be driven by a fixed-frequency reference frequency signal $s_{REF}$, which may be a higher frequency $f_{REF}$ than the frequency $f_D(t)$ of the DDFS output signal $s_D(t)$. The reference frequency signal $s_{REF}$ may be generated by the reference oscillator 304. The reference frequency signal $s_{REF}$ generated in the reference oscillator 304 may also be divided by a factor N in the frequency divider 308 to generate the divided reference frequency signal $s'_{REF}$. The divided reference frequency signal $s'_{REF}$ may be used to translate the DDFS output signal $s_D(t)$ in frequency. This may be achieved by multiplying in multiplier 310 the divided reference frequency signal $s'_{REF}$ with $s_D(t)$ to generate the unfiltered carrier frequency signal $s_{C1}(t)$. The carrier frequency signal $s_C(t)$ may be obtained by filtering the unfiltered carrier frequency signal $s_{C1}(t)$ in filter 312.

An embodiment of the invention may offer a higher signal quality and higher carrier frequencies than generation of the carrier frequency signal $f_C(t)$ directly in the DDFS 306. The DDFS 306 may comprise a Digital-to-Analog converter that may output a new signal level every $1/f_{REF}$ seconds. Hence, as the frequency $f_D(t)$ of the DDFS output signal $s_D(t)$ may vary while the rate of signal level changes of $s_D(t)$ may remain constant, the number of samples per period of the DDFS output signal $s_D(t)$ may vary and may be given by $f_{REF}/f_D(t)$ samples per period of the frequency signal $s_D(t)$. Due to the digital-to-analog conversion, the frequency signal $s_D(t)$ may resemble, for example, an ideal sinusoid more closely with an increasing number of samples per period, that is, with increasing $f_{REF}/f_D(t)$. A high carrier frequency $f_C(t)$ of good signal quality may be achieved through frequency translation in the multiplier 310, as shown in the following relationship:

$$s_{C1}(t) = s'_{REF}(t) \cdot s_D(t) \quad (1)$$

$$= \cos\left(2\pi \frac{f_{REF}}{N} t\right) \cdot \cos(2\pi f_D(t) t)$$

$$= \frac{1}{2}\left[\cos\left(2\pi\left(\frac{f_{REF}}{N} - f_D(t)\right)\right) + \cos\left(2\pi\left(\frac{f_{REF}}{N} + f_D(t)\right)\right)\right]$$

Hence, after multiplication, the unfiltered carrier frequency signal $s_{C1}(t)$ may contain frequency components corresponding to the sum and difference of the frequencies $f_D(t)$ and $f_{REF}/N$. By low-pass filtering the unfiltered carrier frequency signal $s_{C1}(t)$ in filter 312, the difference component may be removed and the carrier frequency $s_C(t)$ may be obtained:

$$s_C(t) = \frac{1}{2}\cos\left(2\pi\left(\frac{f_{REF}}{N} + f_D(t) t\right)\right)$$

For example, with a reference frequency $f_{REF}=24$ GHz, as may be achieved with modern semiconductor manufacturing processes of, for example, 45 nm, $f_D(t)$ may, for example, vary from 0-4 GHz and may have at least $f_{REF}/\max\{f_D(t)\}=6$ samples per period. The frequency divider 308 may generate, for example, a signal $s'_{REF}(t)$ with N=4 that may be of frequency $f_{REF}/N=6$ GHz. As illustrated in this example, the carrier frequency $f_C(t)$ may be varied from 6-10 GHz.

In another embodiment of the invention, the filter 312 may be replaced by a filter that may comprise switchable high-pass and low-pass filter characteristics. In this regard, the filter 312 may be enabled to switch so that it possesses low-pass characteristics or switch so that it possesses high-pass characteristics. In these instances, the switchable filter 312 may filter out either the sum or difference component in equation (1) above and therefore may extend the achievable frequency range $f_C(t)$. For example, if $f_D(t)$ may vary from 0-4 GHz, $f_{REF}/N=6$, as illustrated in the example above, the frequency may range from 6-10 GHz when the switchable filter 312 may be a low-pass filter and from 2-6 GHz when the switchable filter 312 may be a high-pass filter. In these instances, the fast-switching PLL 310 may vary its carrier frequency from 2 GHz to 10 GHz.

Figure 4:
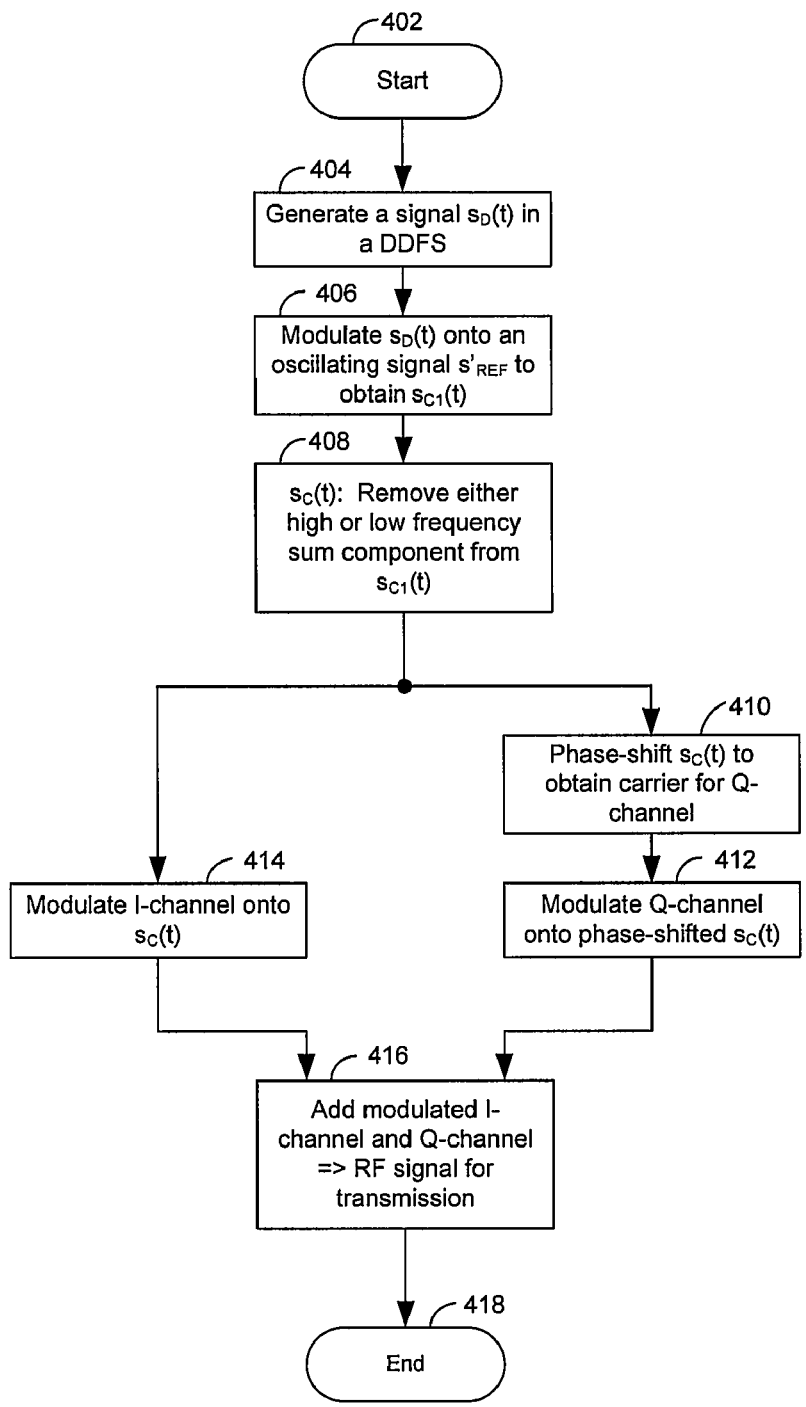
FIG. 4 is a flow chart illustrating overall functionality, in accordance with an embodiment of the invention.

FIG. 4 is a flow chart illustrating overall functionality, in accordance with an embodiment of the invention. Referring to FIG. 4, there is shown a start step 402, process steps 404, 406, 408, 410, 412, 414 and 416, and an end step 418.

In accordance with an embodiment of the invention, a signal $s_D(t)$ that may be fast-varying may be generated in process step 404. This process may correspond to the output of the DDFS 306 shown in FIG. 3. $s_D(t)$ may be modulated onto $s'_{REF}$ in process step 506 to generate the unfiltered carrier signal $s_{C1}(t)$. In step 508, a high or low frequency-sum component may be removed from the unfiltered carrier frequency signal $s_{C1}(t)$ to generate $s_C(t)$, the carrier frequency signal illustrated in FIG. 3. In step 514, the I-channel data may be modulated onto the carrier frequency signal $s_C(t)$. In step 510, the carrier frequency signal $s_C(t)$ may be phase-shifted to generate a carrier signal appropriate for modulation of the Q-channel in step 512. In step 516, the modulated I-channel and the modulated Q-channel signals may be added to form an RF signal that may be suitable for transmission.

In accordance with an embodiment of the invention, a method and system for a fast-switching Phase-Locked Loop using a Direct Digital Frequency Synthesizer may include generating a second signal from a first signal by: frequency translating in 204 an inphase component of the first signal utilizing a filtered fast-switching oscillating signal generated using a direct digital frequency synthesizer (DDFS) 210 and frequency translating in 208 a corresponding quadrature component of the first signal utilizing a phase-shifted version of the generated filtered fast-switching oscillating signal, as illustrated in FIG. 2. The filtered fast-switching oscillating signal $s_C(t)$ may be generated by filtering a fast-switching oscillating signal in filter 312, shown in FIG. 3. The inphase and quadrature components of the first signal may be multiplied with the filtered fast-switching oscillating signal and a phase-shifted version of the filtered fast-switching oscillating signal, respectively as illustrated in FIG.2 and FIG. 4. The filtered fast-switching oscillating signal $s_C(t)$ may be obtained by removing at least one frequency-sum term of the fast-switching oscillating signal $s_{C1}(t)$ by filter 312, where the fast-switching signal oscillating signal $s_{C1}(t)$ may be generated from a signal $s_D(t)$ generated by the DDFS 306 that may be multiplied with an oscillating reference signal $s'_{REF}$. The oscillating reference signal $s'_{REF}$ may comprise a fixed-frequency. By frequency-dividing, as shown in block 308 in FIG. 3, a high-frequency oscillating signal $s_{REF}$, the fixed-frequency oscillating reference signal $s'_{REF}$ may be generated. The DDFS 308 may be clocked by the high-frequency oscillating signal $s_{REF}$. The second signal may be generated during demodulation or during modulation of the first signal, as shown in FIG. 2. Filtering of the fast-switching oscillating signal may utilize a high-pass filter 302, a low-pass filter 302 or a switchable filter 302 that switches between high-pass and low-pass filtering characteristics, as illustrated in FIG. 3.

Another embodiment of the invention may provide a machine-readable storage, having stored thereon, a computer program having at least one code section executable by a machine, thereby causing the machine to perform the steps as described above for a Method and System for a fast-switching Phase-locked Loop using a Direct Digital Frequency Synthesizer.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
  generating a second signal from a first signal by:
    frequency translating an inphase component of said first signal utilizing a filtered fast-switching oscillating signal generated using at least a direct digital frequency synthesizer (DDFS);
    frequency translating a corresponding quadrature component of said first signal utilizing a phase-shifted version of said generated filtered fast-switching oscillating signal; and
    filtering said generated fast-switching oscillating signal utilizing a high-pass filter.

2. The method according to claim 1, comprising generating said filtered fast-switching oscillating signal by filtering a fast-switching oscillating signal.

3. The method according to claim 1, comprising multiplying said inphase component of said first signal with said filtered fast-switching oscillating signal.

4. The method according to claim 1, comprising multiplying said quadrature component of said first signal by said phase-shifted version of said filtered fast-switching oscillating signal.

5. The method according to claim 1, comprising generating said filtered fast-switching oscillating signal by removing at least one frequency-sum term of said fast-switching oscillating signal.

6. The method according to claim 5, comprising generating said fast-switching oscillating signal by multiplying a signal generated from said direct digital frequency synthesizer with an oscillating reference signal.

7. The method according to claim 6, wherein said oscillating reference signal comprises a fixed-frequency.

8. The method according to claim 7, comprising generating said fixed-frequency oscillating reference signal by frequency-dividing a high-frequency oscillating signal.

9. The method according to claim 8, comprising clocking said direct digital frequency synthesizer by said high-frequency oscillating signal.

10. The method according to claim 1, comprising generating said second signal from said first signal during demodulation of said first signal.

11. The method according to claim 1, comprising generating said second signal from said first signal during modulation of said first signal.

12. The method according to claim 1, comprising filtering said generated fast-switching oscillating signal utilizing a low-pass filter.

13. The method according to claim 1, comprising filtering said generated fast-switching oscillating signal utilizing a switchable filter that switches between high-pass filtering characteristics and low-pass filtering characteristics.

14. A system for processing communication signals, the system comprising:
  one or more circuits that generate a second signal from a first signal;
  said one or more circuits comprising at least a direct digital frequency synthesizer (DDFS), said one or more circuits frequency translate an inphase component of said first signal utilizing a filtered fast-switching oscillating signal generated using said at least said direct digital frequency synthesizer (DDFS);
  said one or more circuits frequency translate a corresponding quadrature component of said first signal utilizing a phase-shifted version of said generated filtered fast-switching oscillating signal; and
  wherein said one or more circuits comprise a high-pass filter that filters said generated fast-switching oscillating signal.

15. The system according to claim 14, wherein said one or more circuits generate said filtered fast-switching oscillating signal by filtering a fast-switching oscillating signal.

16. The system according to claim 14, wherein said one or more circuits multiply said inphase component of said first signal with said filtered fast-switching oscillating signal.

17. The system according to claim 14, wherein said one or more circuits multiply said quadrature component of said first signal by said phase-shifted version of said filtered fast-switching oscillating signal.

18. The system according to claim 14, wherein said one or more circuits generate said filtered fast-switching oscillating signal by removing at least one frequency-sum term of said fast-switching oscillating signal.

19. The system according to claim 18, wherein said one or more circuits generate said fast-switching oscillating signal by multiplying a signal generated from said direct digital frequency synthesizer with an oscillating reference signal.

20. The system according to claim 19, wherein said oscillating reference signal comprises a fixed-frequency.

21. The system according to claim 20, wherein said one or more circuits generate said fixed-frequency oscillating reference signal by frequency-dividing a high-frequency oscillating signal.

22. The system according to claim 21, wherein said one or more circuits clock said direct digital frequency synthesizer by said high-frequency oscillating signal.

23. The system according to claim 14, wherein said one or more circuits generate said second signal from said first signal during demodulation of said first signal.

24. The system according to claim 14, wherein said one or more circuits generate said second signal from said first signal during modulation of said first signal.

25. The system according to claim 14, wherein said one or more circuits comprise a low-pass filter that filters said generated fast-switching oscillating signal.

26. The system according to claim 14, wherein said one or more circuits comprise a switchable filter that filters said generated fast-switching oscillating signal, wherein said switchable filter switches between high-pass filtering characteristics and low-pass filtering characteristics.

27. A method for processing communication signals, the method comprising:
generating a second signal from a first signal by:
frequency translating an inphase component of said first signal utilizing a filtered fast-switching oscillating signal generated using at least a direct digital frequency synthesizer (DDFS);
frequency translating a corresponding quadrature component of said first signal utilizing a phase-shifted version of said generated filtered fast-switching oscillating signal; and
filtering said generated fast-switching oscillating signal utilizing a switchable filter that switches between high-pass filtering characteristics and low-pass filtering characteristics.

28. The method according to claim 27, comprising generating said filtered fast-switching oscillating signal by filtering a fast-switching oscillating signal.

29. The method according to claim 27, comprising multiplying said inphase component of said first signal with said filtered fast-switching oscillating signal.

30. The method according to claim 27, comprising multiplying said quadrature component of said first signal by said phase-shifted version of said filtered fast-switching oscillating signal.

31. The method according to claim 27, comprising generating said filtered fast-switching oscillating signal by removing at least one frequency-sum term of said fast-switching oscillating signal.

32. The method according to claim 31, comprising generating said fast-switching oscillating signal by multiplying a signal generated from said direct digital frequency synthesizer with an oscillating reference signal.

33. The method according to claim 32, wherein said oscillating reference signal comprises a fixed-frequency.

34. The method according to claim 33, comprising generating said fixed-frequency oscillating reference signal by frequency-dividing a high-frequency oscillating signal.

35. The method according to claim 34, comprising clocking said direct digital frequency synthesizer by said high-frequency oscillating signal.

36. The method according to claim 27, comprising generating said second signal from said first signal during demodulation of said first signal.

37. The method according to claim 27, comprising generating said second signal from said first signal during modulation of said first signal.

38. The method according to claim 27, comprising filtering said generated fast-switching oscillating signal utilizing a low-pass filter.

39. The method according to claim 27, comprising filtering said generated fast-switching oscillating signal utilizing a switchable filter that switches between high-pass filtering characteristics and low-pass filtering characteristics.

40. A system for processing communication signals, the system comprising:
one or more circuits that generate a second signal from a first signal;
said one or more circuits comprising at least a direct digital frequency synthesizer (DDFS), said one or more circuits frequency translate an inphase component of said first signal utilizing a filtered fast-switching oscillating signal generated using said at least said direct digital frequency synthesizer (DDFS);
said one or more circuits frequency translate a corresponding quadrature component of said first signal utilizing a phase-shifted version of said generated filtered fast-switching oscillating signal; and
wherein said one or more circuits comprise a switchable filter that filters said generated fast-switching oscillating signal, wherein said switchable filter switches between high-pass filtering characteristics and low-pass filtering characteristics.

41. The system according to claim 40, wherein said one or more circuits generate said filtered fast-switching oscillating signal by filtering a fast-switching oscillating signal.

42. The system according to claim 40, wherein said one or more circuits multiply said inphase component of said first signal with said filtered fast-switching oscillating signal.

43. The system according to claim 40, wherein said one or more circuits multiply said quadrature component of said first signal by said phase-shifted version of said filtered fast-switching oscillating signal.

44. The system according to claim 40, wherein said one or more circuits generate said filtered fast-switching oscillating signal by removing at least one frequency-sum term of said fast-switching oscillating signal.

45. The system according to claim 44, wherein said one or more circuits generate said fast-switching oscillating signal by multiplying a signal generated from said direct digital frequency synthesizer with an oscillating reference signal.

46. The system according to claim 45, wherein said oscillating reference signal comprises a fixed-frequency.

47. The system according to claim 46, wherein said one or more circuits generate said fixed-frequency oscillating reference signal by frequency-dividing a high-frequency oscillating signal.

48. The system according to claim 47, wherein said one or more circuits clock said direct digital frequency synthesizer by said high-frequency oscillating signal.

49. The system according to claim 40, wherein said one or more circuits generate said second signal from said first signal during demodulation of said first signal.

50. The system according to claim 40, wherein said one or more circuits generate said second signal from said first signal during modulation of said first signal.

51. The system according to claim 40, wherein said one or more circuits comprise a low-pass filter that filters said generated fast-switching oscillating signal.

52. The system according to claim 40, wherein said one or more circuits comprise a switchable filter that filters said generated fast-switching oscillating signal, wherein said switchable filter switches between high-pass filtering characteristics and low-pass filtering characteristics.

* * * * *